(12) United States Patent
McGarvey

(10) Patent No.: US 11,428,826 B2
(45) Date of Patent: Aug. 30, 2022

(54) SILICON PHOTOMULTIPLIERS WITH SPLIT MICROCELLS

(71) Applicant: SEMICONDUCTOR COMPONENTS INDUSTRIES, LLC, Phoenix, AZ (US)

(72) Inventor: Brian Patrick McGarvey, Templemartin (IE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 177 days.

(21) Appl. No.: 16/670,527

(22) Filed: Oct. 31, 2019

(65) Prior Publication Data
US 2021/0072411 A1    Mar. 11, 2021

Related U.S. Application Data

(60) Provisional application No. 62/897,649, filed on Sep. 9, 2019.

(51) Int. Cl.
*H01L 27/14* (2006.01)
*G01T 1/24* (2006.01)
(Continued)

(52) U.S. Cl.
CPC .............. *G01T 1/248* (2013.01); *G01T 1/247* (2013.01); *H01L 27/1463* (2013.01);
(Continued)

(58) Field of Classification Search
None
See application file for complete search history.

(56) References Cited

U.S. PATENT DOCUMENTS 7,015,115 B1 *  3/2006  Yin ............... H01L 21/76202
                                    257/E21.552
7,759,623 B2    7/2010  Teshima et al.
(Continued)

FOREIGN PATENT DOCUMENTS

WO    2009022166 A2    2/2009
WO    2015059663 A1    4/2015

*Primary Examiner* — Hung K Vu
(74) *Attorney, Agent, or Firm* — Treyz Law Group, P.C.; Joseph F. Guihan

(57) ABSTRACT

A semiconductor device may include a plurality of single-photon avalanche diodes. The single-photon avalanche diodes may be arranged in microcells. Each microcell may be a split microcell with first and second independent microcell segments. Each microcell segment in the split microcell may have a respective single-photon avalanche diode that is coupled to an output line. The single-photon avalanche diode of each microcell segment may also be coupled to a respective resistor that is used to quench avalanches in the single-photon avalanche diode. Splitting the microcell may reduce the recovery time of each microcell. The segments of the split microcell may be positioned close together, even if susceptible to optical crosstalk. Intra-microcell isolation structures may be formed between the microcell segments. Inter-microcell isolation structures may be formed around a perimeter of the split microcell. The intra-microcell and inter-microcell isolation structures may be different.

17 Claims, 9 Drawing Sheets

(51) Int. Cl.
*H01L 27/146* (2006.01)
*H01L 31/02* (2006.01)
*H01L 31/107* (2006.01)

(52) U.S. Cl.
CPC .. *H01L 27/14636* (2013.01); *H01L 27/14658* (2013.01); *H01L 31/02027* (2013.01); *H01L 31/107* (2013.01)

(56) References Cited

U.S. PATENT DOCUMENTS

| | | | |
|---|---|---|---|
| 9,029,772 B2 | 5/2015 | Pavlov | |
| 9,768,211 B2 * | 9/2017 | Harmon | H01L 31/00 |
| 2013/0187131 A1 * | 7/2013 | Chung | H01L 51/5234 |
| | | | 257/40 |

* cited by examiner

SILICON PHOTOMULTIPLIERS WITH SPLIT MICROCELLS

CROSS-REFERENCE TO RELATED APPLICATIONS

This application claims the benefit of U.S. Provisional Patent Application No. 62/897,649, filed on Sep. 9, 2019, the entire contents of which is incorporated herein by reference.

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals. Each pixel may also include a microlens that overlaps and focuses light onto the photosensitive element.

Conventional image sensors may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. Single-photon avalanche diodes may be capable of single-photon detection. However, long recovery times between avalanches caused by incident photons may result in poor performance.

It is within this context that the embodiments described herein arise.

DETAILED DESCRIPTION

Embodiments of the present invention relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves, and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices, on the other hand, the photon detection principle is different. The light sensing diode is biased above its breakdown point, and when an incident photon generates an electron or hole, this carrier initiates an avalanche breakdown with additional carriers being generated. The avalanche multiplication may produce a current signal that can be easily detected by readout circuitry associated with the SPAD. The avalanche process can be stopped (or quenched) by lowering the diode bias below its breakdown point. Each SPAD may therefore include a passive and/or active quenching circuit for halting the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
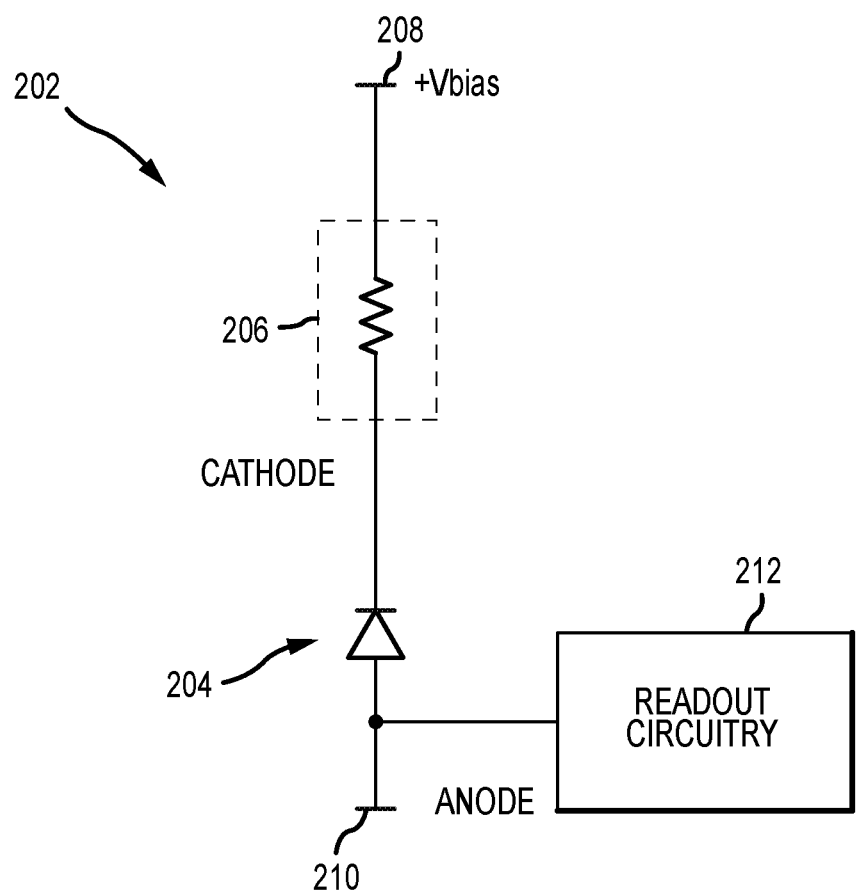
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 210 (e.g., a ground power supply voltage terminal) and a second supply voltage terminal 208 (e.g., a positive power supply voltage terminal). In particular, SPAD device 202 includes a SPAD 204 having an anode terminal connected to power supply voltage terminal 210 and a cathode terminal connected directly to quenching circuitry 206. SPAD device 202 that includes SPAD 204 connected in series with a quenching resistor 206 is sometimes referred to collectively as a photo-triggered unit or "microcell." During operation of SPAD device 202, supply voltage terminals 208 and 210 may be used to bias SPAD 204 to a voltage that is higher than the breakdown voltage (e.g., bias voltage Vbias is applied to terminal 208). Breakdown voltage is the largest reverse voltage that can be applied to SPAD 204 without causing an exponential increase in the leakage current in the diode. When SPAD 204 is reverse biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor component is used to form quenching circuitry 206. This is an example of passive quenching circuitry.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing. In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and terminal 210 (e.g., the anode) is merely illustrative. Readout circuitry 212 may be coupled to terminal 208 or any desired portion of the SPAD device (e.g., to the cathode of the SPAD device). In some cases, quenching circuitry 206 may be considered integral with readout circuitry 212.

Because SPAD devices can detect a single incident photon, the SPAD devices are effective at imaging scenes with low light levels. Each SPAD may detect the number of photons that are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
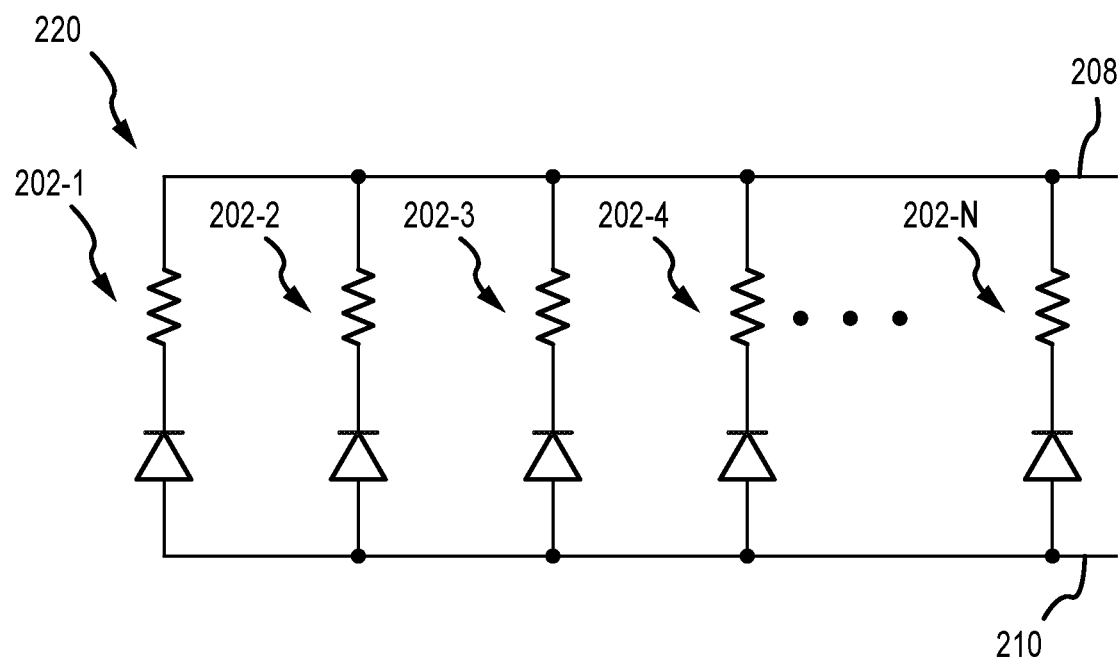
FIG. 2 is a diagram of an illustrative silicon photomultiplier in accordance with an embodiment.

Multiple SPAD devices may be grouped together to help increase dynamic range. FIG. 2 is a circuit diagram of an illustrative group 220 of SPAD devices 202. The group or array of SPAD devices may sometimes be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier 220.

Each SPAD device 202 may sometimes be referred to herein as a SPAD pixel 202. Although not shown explicitly in FIG. 2, readout circuitry for the silicon photomultiplier 220 may measure the combined output current from all of SPAD pixels in the silicon photomultiplier. Configured in this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of FIG. 2 in which the plurality of SPAD pixels 202 share a common output in silicon photomultiplier 220 is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
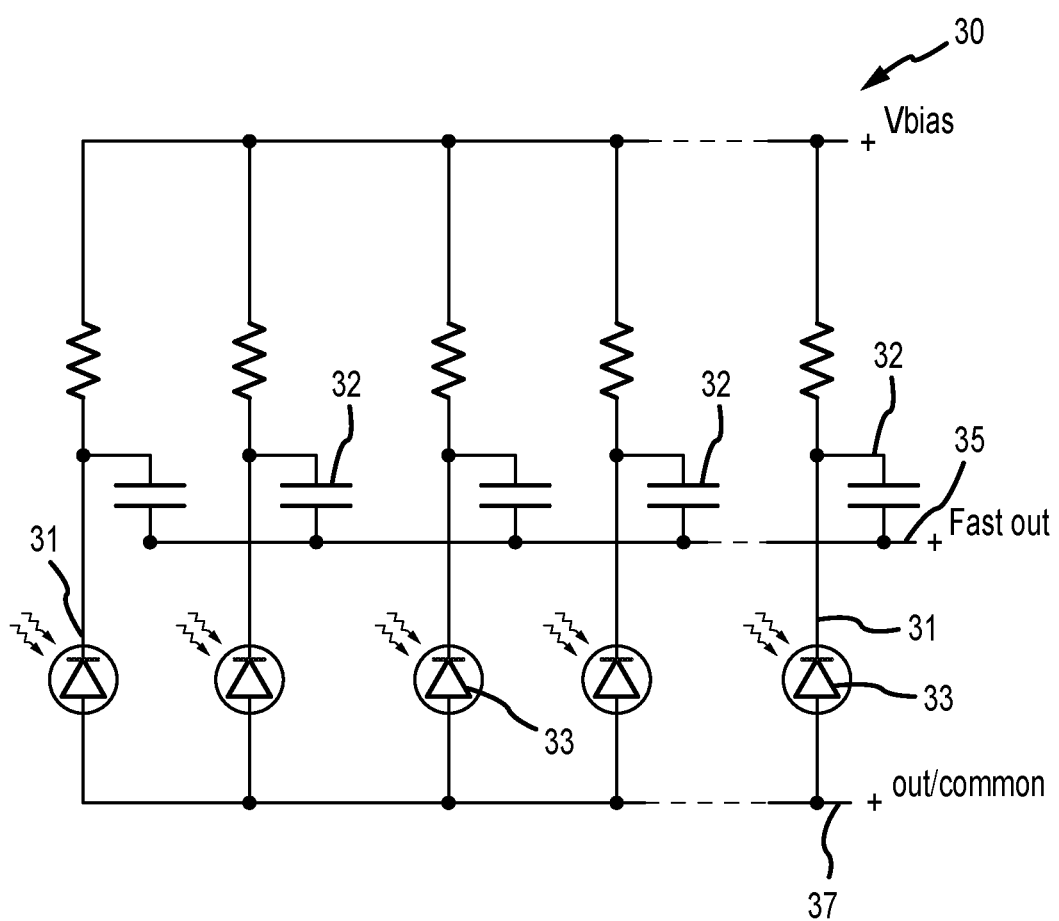
FIG. 3 is a schematic diagram of an illustrative silicon photomultiplier with a fast output terminal in accordance with an embodiment.

FIG. 3 illustrates a silicon photomultiplier 30. As shown in FIG. 3, SiPM 30 has a third terminal 35 which is capacitively coupled to each cathode terminal 31 in order to provide a fast readout of the avalanche signals from the SPADs 33. When then SPADs 33 emits a current pulse, part of the resulting change in voltage at the cathode 31 will be coupled via the mutual capacitance into the third ("fast") output terminal 35. Using the third terminal 35 for readout avoids the compromised transient performance resulting from the relatively large RC time constant associated with the biasing circuit that biases the top terminal of the quenching resistor.

Figure 4:
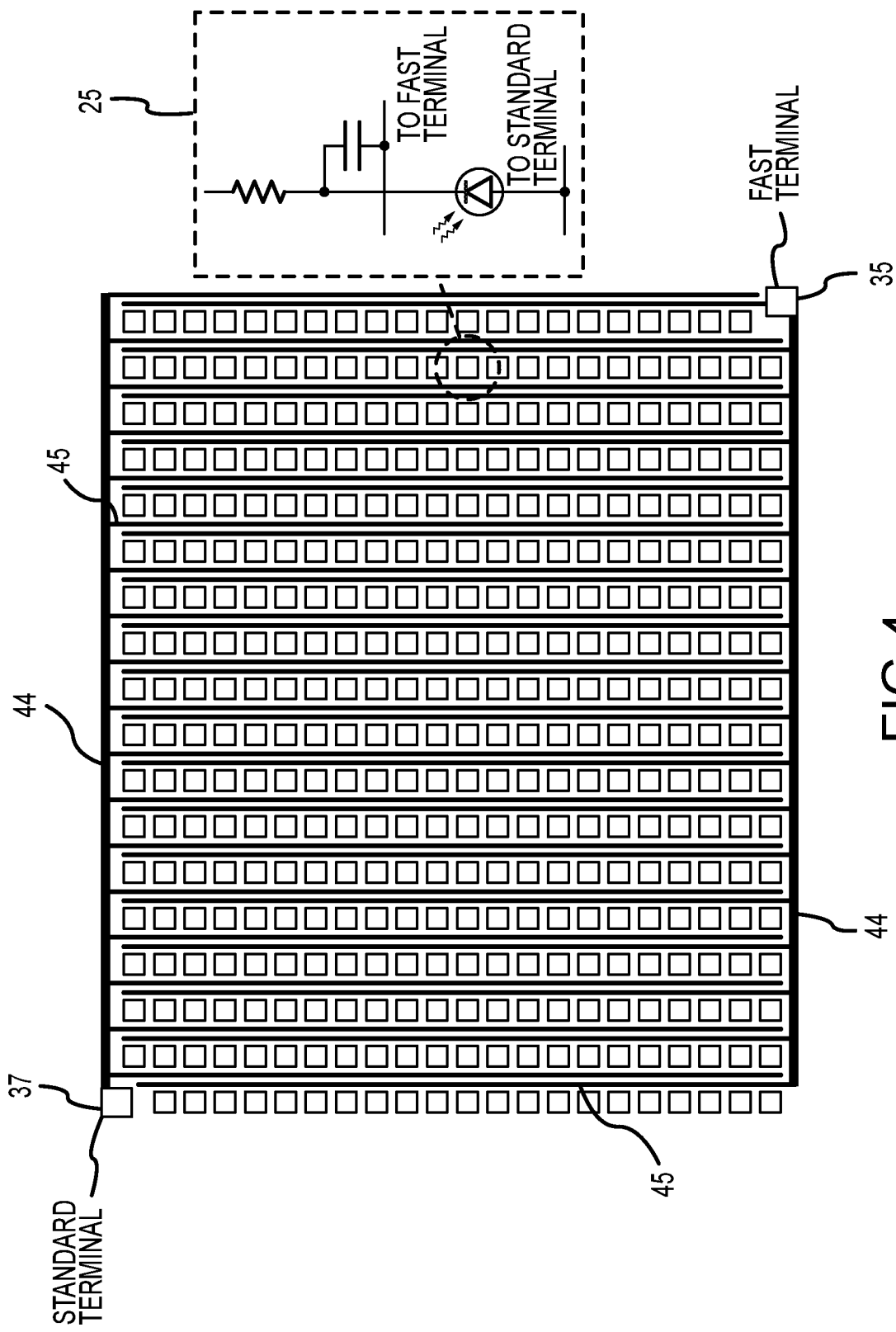
FIG. 4 is a diagram of an illustrative silicon photomultiplier comprising an array of microcells.

It will be appreciated by those skilled in the art that silicon photomultipliers include major bus lines 44 and minor bus lines 45 as illustrated in FIG. 4. The minor bus liens 45 may connect directly to each individual microcell 25. The minor bus lines 45 are then coupled to the major bus lines 44 which connect to the bond pads associated with terminals 37 and 35. Typically, the minor bus lines 45 extend vertically between the columns of microcells 25, whereas the major bus lines 44 extend horizontally adjacent the outer row of the microcells 25.

Figure 5:
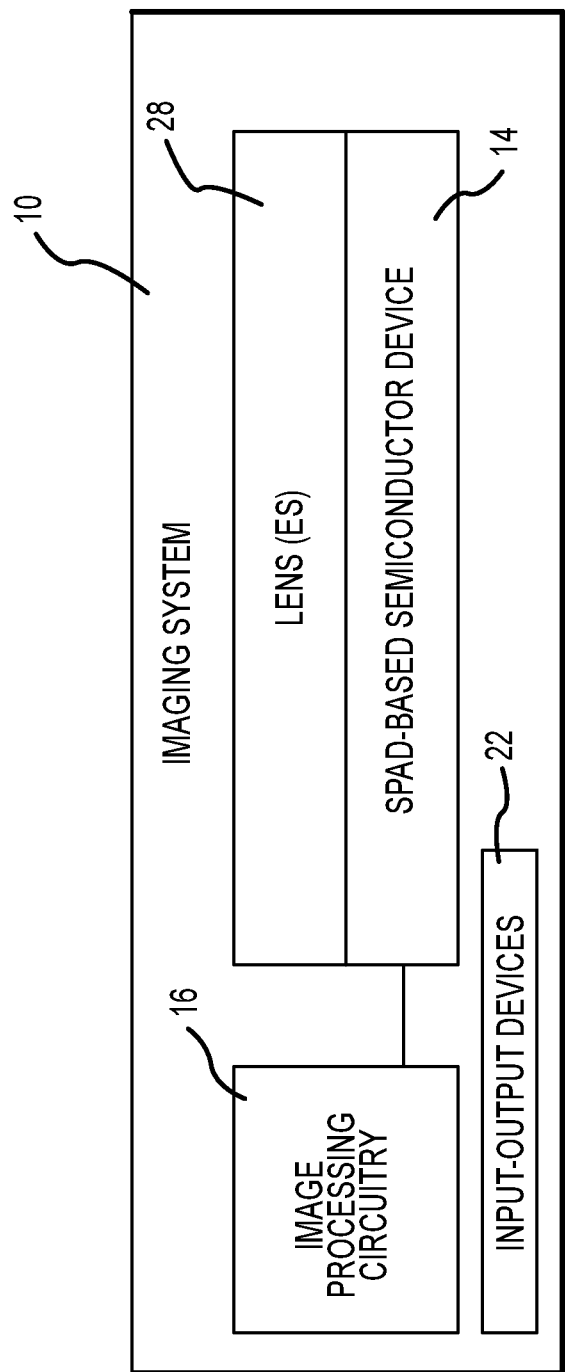
FIG. 5 is a schematic diagram of an illustrative imaging system that includes a SPAD-based semiconductor device in accordance with an embodiment.

An imaging system 10 with a SPAD-based semiconductor device is shown in FIG. 5. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system 10 may be used for LIDAR applications.

Imaging system 10 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more).

The SPAD-based semiconductor device 14 may optionally include additional circuitry such as logic gates, digital counters, time-to-digital converters, bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component may be included in the imaging system to emit light (e.g., infrared light or light of any other desired type). Semiconductor device 14 may measure the reflection of the light off of an object to measure distance to the object in a LIDAR (light detection and ranging) scheme.

Each single-photon avalanche diode in SPAD-based semiconductor device 14 may have an associated recovery time. As previously discussed, when a photon causes an avalanche current in the SPAD, quenching circuitry may stop the avalanche current. After the avalanche current is stopped, the supply voltage terminals may be used to again bias SPAD 204 to a voltage that is higher than the breakdown voltage (thus placing the SPAD in condition to detect another incident photon).

Quenching circuitry 206 may be passive quenching circuitry or active quenching circuitry. Passive quenching circuitry may, without external control or monitoring, automatically quench the avalanche current once initiated. For example, FIG. 1 shows an example where a resistor component is used to form quenching circuitry 206. This is an example of passive quenching circuitry. Active quenching circuitry may also be used in SPAD device 202 as discussed in connection with FIG. 1.

The length of time between an avalanche current being triggered and the SPAD being ready to detect another photon may be referred to as a reset time, recovery time, recharge time, etc. In general, the recovery time may be proportional to the microcell's capacitance and the quench resistance. However, these factors may affect other aspects of the SPAD performance and cannot necessarily be arbitrarily reduced.

To reduce recovery time, each microcell may be divided into two or more independently connected segments. Each microcell segment (sometimes referred to as a microcell portion) may therefore have a smaller area than a single continuous microcell. The capacitance of the microcell may be proportional to the size of the microcell. Thus, consider an example of a microcell that is divided into two evenly sized segments (halves). Each segment may have a respective capacitance that is lower than the capacitance of a single microcell twice the size. Therefore, the recovery time for the microcell segment will be reduced compared to the recovery time of a microcell twice the size.

Microcells may sometimes be susceptible to optical crosstalk. Normally, crosstalk is undesirable and the microcells may be sized, positioned, and/or shielded to prevent optical crosstalk. Crosstalk occurs when a photon incident on a first microcell causes an avalanche current on the first microcell and a neighboring microcell. The avalanche current of the first microcell can in turn create photons that, during optical crosstalk, travel to a second, neighboring microcell and cause an avalanche current in the second microcell. This type of optical crosstalk is typically undesirable due to reduced dynamic range and reduced signal accuracy.

However, when a microcell is split into multiple segments for recovery time gains as discussed above, the optical crosstalk phenomenon may no longer be a detriment. The gap between microcell segments may be made small (even if there is a high probability of crosstalk). In some examples, the gap between microcell segments may be made sufficiently small to ensure optical crosstalk between the microcell segments (e.g., a 100% crosstalk probability). Consequently, whenever one of the microcell segments avalanches, the other microcell segment will also avalanche.

Splitting the microcell in this manner results in the recovery time of the microcell being equivalent to the recovery time of one the microcell segments. Since the microcell segments have a smaller area than an un-segmented area, the recovery time is reduced compared to an example where an un-segmented microcell is used.

Figure 6:
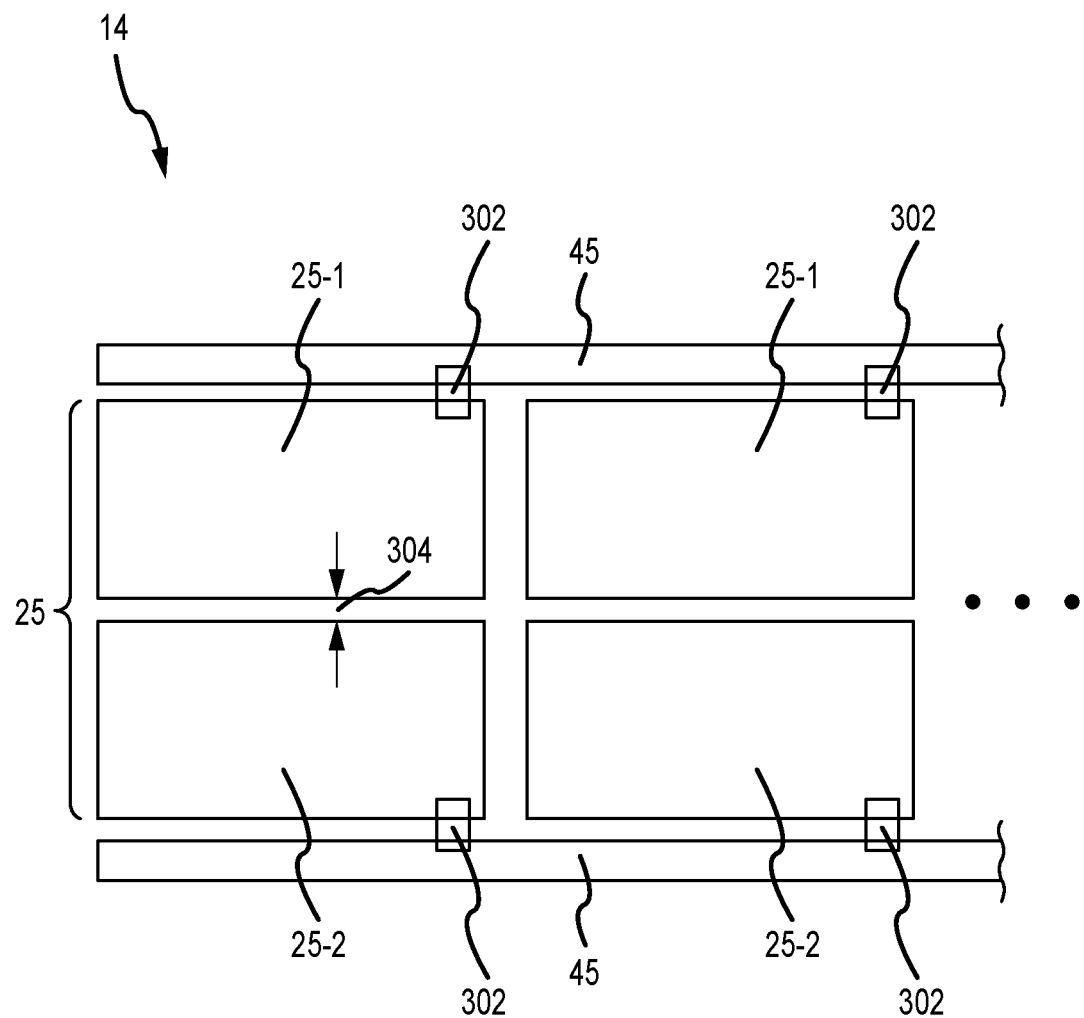
FIG. 6 is a top view of an illustrative SPAD-based semiconductor device with split microcells in accordance with an embodiment.

FIG. 6 is a top view of an illustrative SPAD-based semiconductor device with split microcells. As shown in FIG. 6, a given microcell 25 may have a first microcell portion 25-1 and a second microcell portion 25-2. Each microcell in the SPAD-based semiconductor device 14 may be split in this manner. Each microcell portion may have a respective output contact 302 that is electrically connected to an output line such as minor bus line 45. As shown in connection with FIG. 4, the minor bus lines 45 may be coupled to a major bus line 44 if desired. Bus lines 45 may be coupled to the anode of the SPAD associated with each microcell portion in one example and may output a signal that indicates when an avalanche is triggered in the respective SPAD.

Each microcell portion may have a corresponding SPAD 204 with quenching circuitry such as resistor 206. However, the microcell portions are positioned close together. As shown in FIG. 6, microcell portion 25-1 is separated from microcell portion 25-2 by distance 304. Distance 304 may be made as small as possible to increase the ratio of light-sensitive area to non-light-sensitive area on the SPAD-based semiconductor device. Distance 304 may be reduced even if optical crosstalk between microcell portions 25-1 and 25-2 becomes probable or even guaranteed. For example, distance 304 may be less than 10 microns, less than 5 microns, less than 3 microns, less than 2 microns, less than 1 micron, between 1 and 2 microns, between 1 and 1.5 microns, between 1 and 1.2 microns, greater than 1.0 microns, etc. Distance 304 may be above a minimum distance to reduce electrical crosstalk between the microcell portions. Whereas optical crosstalk does not adversely affect the device performance, electrical crosstalk may negatively affect the device performance and may therefore be mitigated. Distance 304 may be sufficiently small such that the optical crosstalk probability between microcell portions 25-1 and 25-2 is greater than 20%, greater than 50%, greater than 75%, greater than 90%, greater than 95%, greater than 99%, greater than 99.9%, less than 100%, between 90% and 100%, etc.

Figure 7:
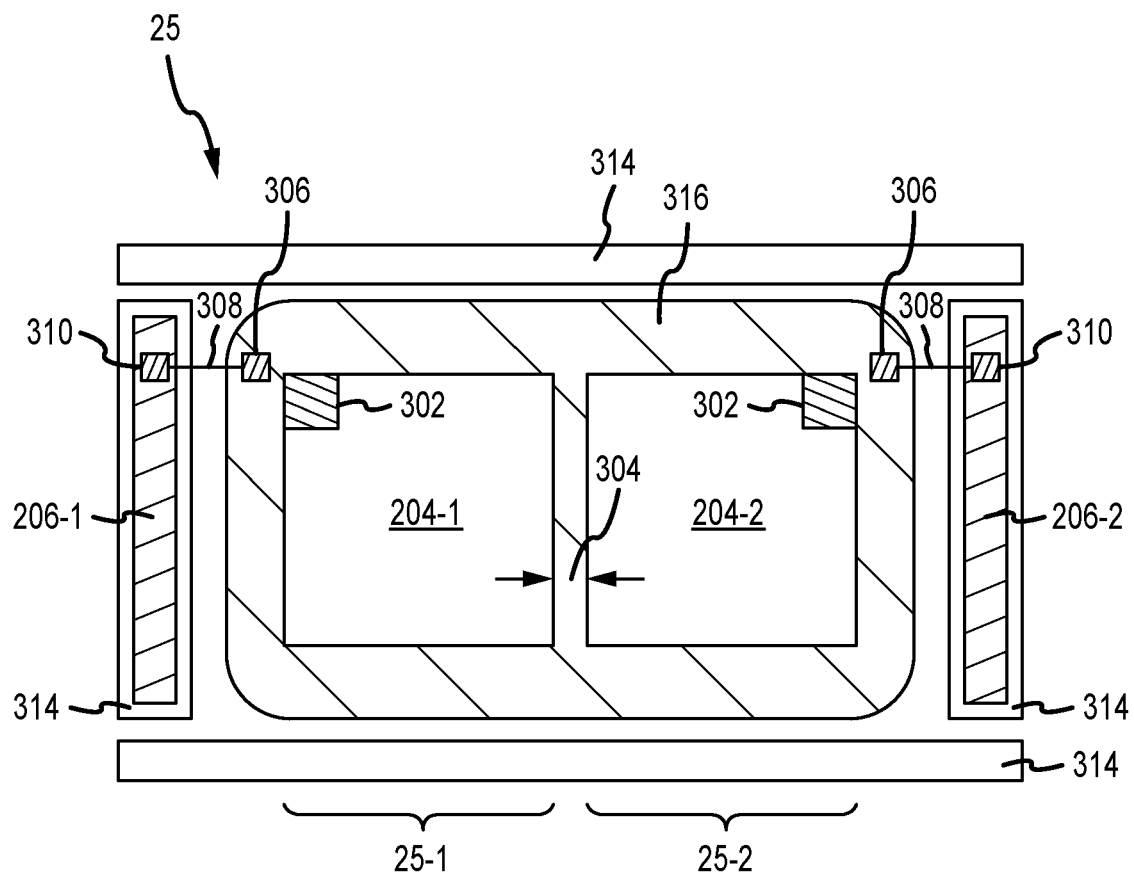
FIG. 7 is a top view of an illustrative split microcell in accordance with an embodiment.

FIG. 7 is a top view of an illustrative split microcell of the type shown in FIG. 6. As shown in FIG. 7, microcell 25 includes first microcell portion 25-1 and second microcell portion 25-2. Microcell portion 25-1 includes a single-photon avalanche diode (SPAD) 204-1. An output contact 302 may electrically contact a portion of SPAD 204-1 (e.g., the anode) to an output line such as line 45 in FIG. 6. Microcell portion 25-1 also includes a resistor 206-1 (e.g., quenching circuitry 206-1). A contact 306 may be coupled to a portion of SPAD 204-1 (e.g., the cathode). Interconnect 308 may electrically contact 306 to contact 310 on resistor 206-1, thus electrically connecting the cathode of SPAD 204-1 to resistor 206-1.

Microcell 25-2 may have a similar arrangement as microcell 25-1. Microcell portion 25-2 includes a single-photon avalanche diode (SPAD) 204-2. An output contact 302 may electrically contact a portion of SPAD 204-2 (e.g., the anode) to an output line such as line 45 in FIG. 6. Microcell portion 25-2 also includes a resistor 206-2 (e.g., quenching circuitry 206-2). A contact 306 may be coupled to a portion of SPAD 204-2 (e.g., the cathode). Interconnect 308 may electrically contact 306 to contact 310 on resistor 206-2, thus electrically connecting the cathode of SPAD 204-2 to resistor 206-2.

Microcell 25 may be surrounded by inter-microcell isolation that includes trench isolation structures 314. Trench isolation structures 314 may be formed from deep trench isolation (DTI) and may be referred to as isolation structures 314, deep trench isolation structures 314, inter-microcell isolation structures 314, etc. In one illustrative arrangement, isolation structures 314 may be formed from polysilicon in a trench in the semiconductor substrate.

The inter-microcell isolation structures may provide sufficient isolation to prevent optical crosstalk between adjacent microcells. However, between the microcell portions of the microcell, it is not necessary to mitigate crosstalk. Therefore, intra-microcell isolation between different microcell portions may be different than the inter-microcell isolation between different microcells.

Microcell 25 may include local oxidation of silicon (LOCOS) portions 316. The LOCOS portions (sometimes referred to as oxidized portions 316) may be formed by silicon dioxide that extends lower than the upper surface of the substrate for the microcell. Having the interface between the substrate and the silicon dioxide be formed at a lower plane than the rest of the substrate (e.g., in SPADs 204-1 and 204-2) may allow LOCOS structures 316 to isolate different sections in the microcell. LOCOS structure 316 may be formed between SPADs 204-1 and 204-2 and may serve as intra-microcell isolation that prevents electrical crosstalk between SPADs 204-1 and 204-2. Additional intra-microcell isolation structures may be included between the microcell portions as will be discussed in more detail in connection with FIG. 8.

Figure 8:
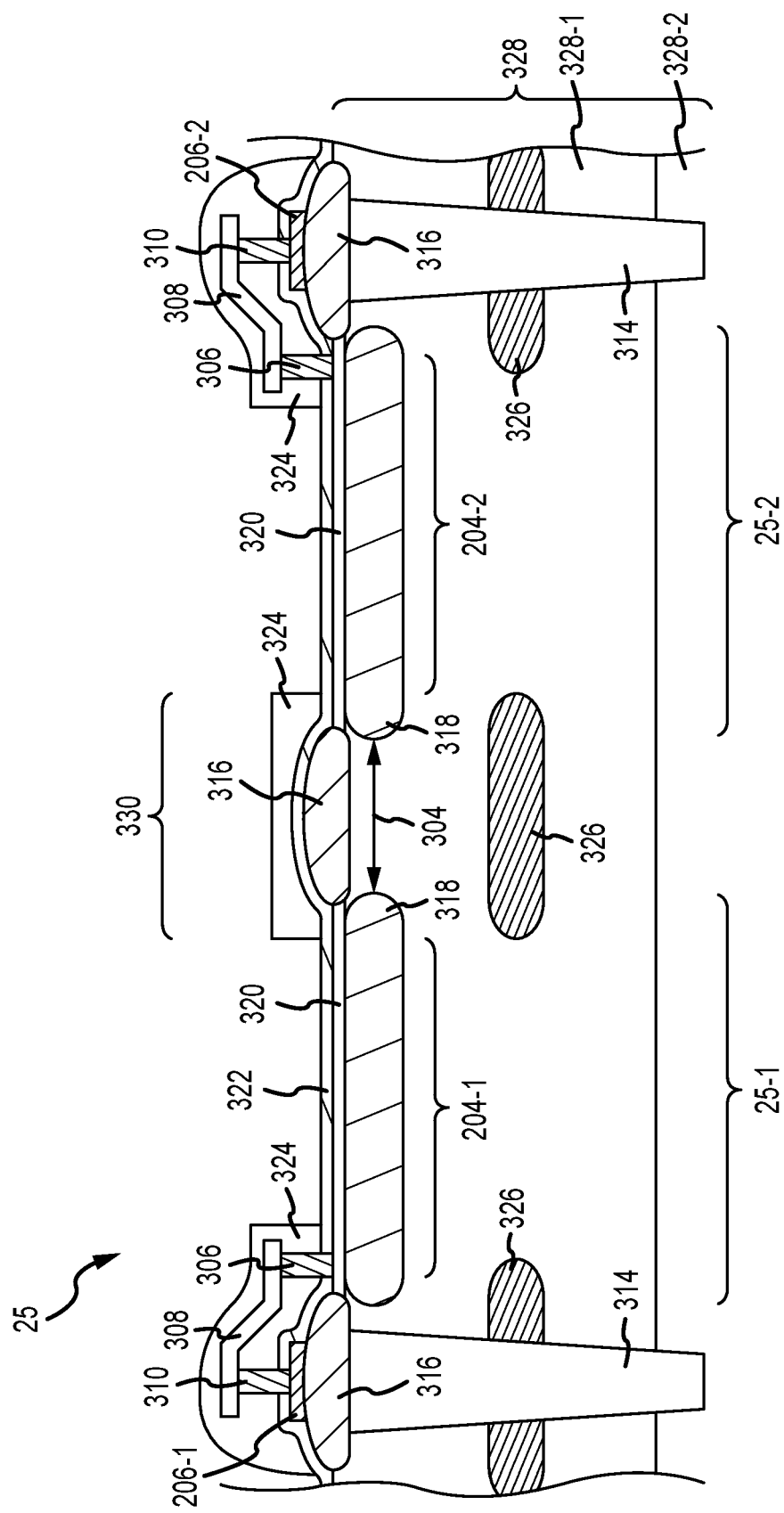
FIG. 8 is a cross-sectional side view of an illustrative split microcell in accordance with an embodiment.

FIG. 8 is a cross-sectional side view showing the split microcell of FIG. 7. The microcell may be formed in a substrate 328. Substrate 328 may optionally include multiple layers. In the example of FIG. 8, substrate 328 has a p-type (p+) epitaxial substrate 328-1 formed on a p+ substrate 328-2. This example is merely illustrative and semiconductor substrate 328 may have other arrangements if desired.

Microcell portion 25-1 includes a single-photon avalanche diode (SPAD) 204-1. SPAD 204-1 may be formed by a p-type implant 318 (sometimes referred to as an enrichment implant) and an n+ implant 320. A contact 306 may be coupled to a portion of SPAD 204-1 (e.g., the cathode formed by n+ implant 320). Interconnect 308 may electrically connect contact 306 to contact 310 on resistor 206-1.

Microcell portion 25-2 includes a single-photon avalanche diode (SPAD) 204-2. SPAD 204-2 may be formed by a p-type implant 318 (sometimes referred to as an enrichment implant) and an n+ implant 320. A contact 306 may be coupled to a portion of SPAD 204-2 (e.g., the cathode formed by n+ implant 320). Interconnect 308 may electrically connect contact 306 to contact 310 on resistor 206-2.

Resistors 206-1 and 206-2 (which may be formed from polysilicon or another desired resistive material) may be formed on oxidized substrate portions 316. Trench isolation structures 314 may be formed under the resistors and LOCOS structures 316. As shown, trench isolation structures 314 may be formed by a trench that extends from LOCOS structures 316 through the substrate layer 328-1 into substrate layer 328-2. An isolating material such as an oxide material or polysilicon may fill the trenches of trench isolation structures 314. Doped portions 326, sometimes referred to as field implants 326, may provide additional isolation between the microcells. The field implants 326 may be p+ type doped regions, for example. Trench isolation structures 314, LOCOS portions 316, and field implants 326 between adjacent microcells may sometimes collectively be referred to as inter-microcell isolation structures.

The split microcell may also include intra-microcell isolation structures 330 that are formed between the microcell portions. Isolation structures 330 may include a LOCOS portion 316 and field implant 326 similar to the inter-microcell isolation structures. However, intra-microcell isolation structures 330 do not include a trench isolation structure 314. The intra-microcell isolation structures may allow a high or guaranteed probability of optical crosstalk between the microcell portions (e.g., an avalanche in diode 204-1 will trigger an avalanche in diode 204-2 and vice versa). This may not adversely affect performance of the SPAD-based semiconductor device.

The intra-pixel isolation structures are therefore different than the inter-pixel isolation structures. This may enable the microcell to be split between segments for improved recovery time while still reducing crosstalk between adjacent microcells and while maximizing the light-sensitive area of the microcell.

An antireflective coating (ARC) 322 may be formed over the substrate. The antireflective coating may be a blanket coating that covers the entire surface of the substrate. Alternatively, the antireflective coating may be patterned to leave portions of the substrate uncovered if desired. Dielectric layers 324 may be formed over the LOCOS structures 316 and some of the contacts and interconnects of the microcell (e.g., contacts 306, 310, and interconnect 308 are covered by dielectric layers 324).

The example of using LOCOS structures 316 in FIG. 8 is merely illustrative. Other isolation structures such as shallow trench isolation (STI) may be used in place of LOCOS structures 316 if desired.

Splitting the microcell as shown in FIGS. 6-8 reduces the recovery time of the microcell. Each microcell portion segment may have a respective capacitance that is lower than the capacitance of a single microcell twice the size. Therefore, the recovery time for the microcell segment will be reduced compared to the recovery time of a microcell twice the size. The microcells shown in FIGS. 6-8 therefore have a reduced recovery time due to the split arrangement.

The example in FIGS. 6-8 of the microcell being split between two segments is merely illustrative. If desired, the microcell may be split between three segments, four segments, more than four segments etc. Regardless of the number of segments, each of the microcell segments may be separated from one another by intra-microcell isolation structures. The perimeter of the microcell may include inter-microcell isolation structures for isolating the microcell from adjacent microcells.

Moreover, referring to the microcells as split microcells with first and second microcell segments is merely illustrative. It should be understood that the microcell segments may instead be considered to be individual microcells. According to this naming scheme, the SPAD-based semiconductor device has some adjacent microcells with first isolation structures (e.g., that may allow optical crosstalk between those microcells) and some adjacent microcells with second isolation structures (e.g. that block most optical crosstalk between those microcells).

Figure 9:
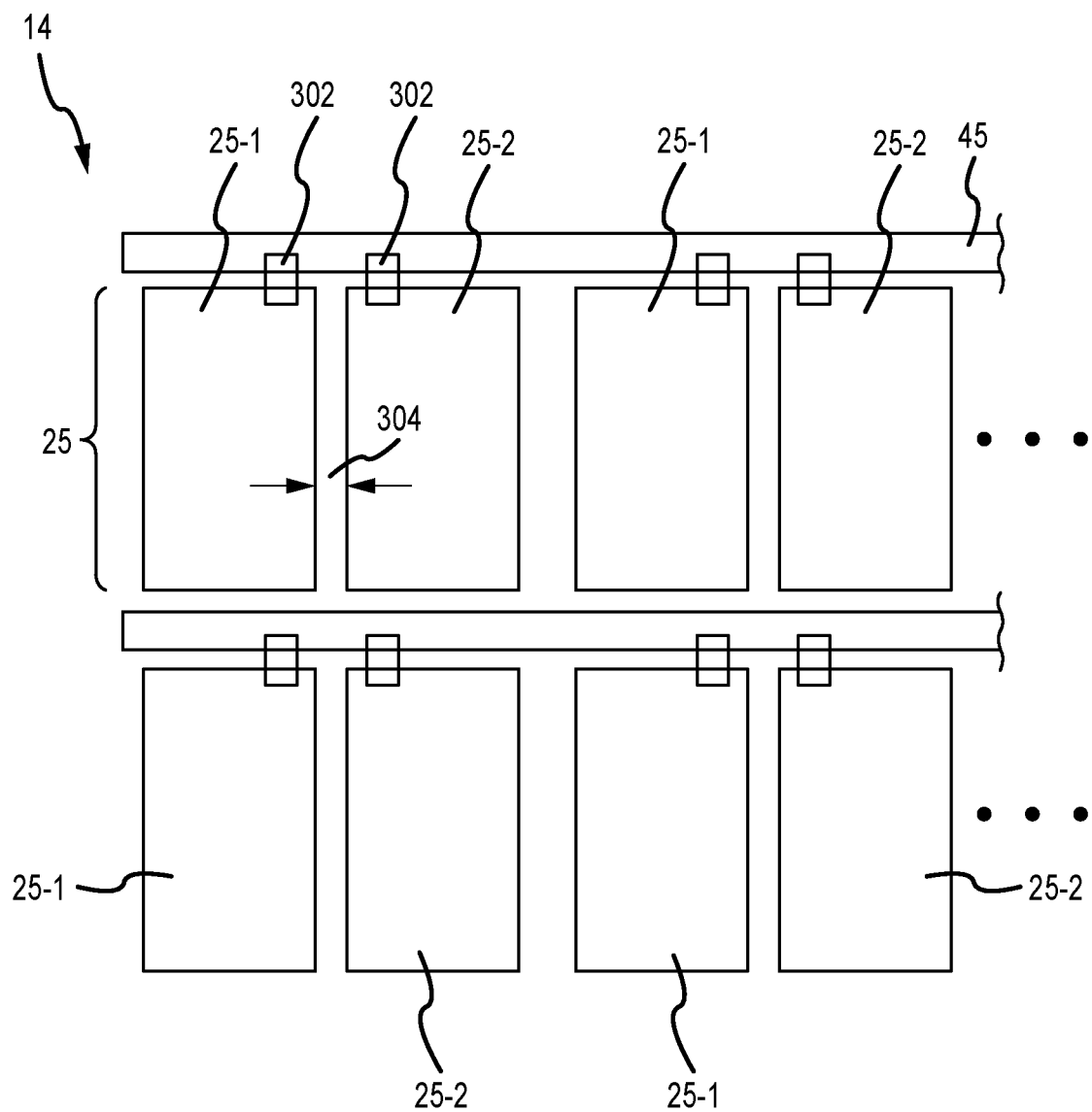
FIG. 9 is a top view of an illustrative SPAD-based semiconductor device with split microcells having adjacent output contacts in accordance with an embodiment.

It should be noted that the illustrative output contact positions shown in FIGS. 6-8 are merely illustrative. In some cases, the output contacts of each microcell segment may be positioned to minimize signal delay between the outputs. FIG. 9 is a top view of an illustrative SPAD-based semiconductor device with split microcells having adjacent outputs for minimized signal delay. As shown in FIG. 9, microcell 25 has first and second microcell segments 25-1 and 25-2 with contacts 302 to the same bus line 45 (as opposed to FIG. 6 where the segments are coupled to different bus lines). Microcell segment 25-1 has a contact 302 in the upper-right corner of the microcell segment whereas microcell segment 25-2 has a contact 302 in the upper-left corner of the microcell segment. Having the contacts of the different microcell segments be positioned adjacent to one another (e.g., in adjacent microcell segment corners) may minimize signal delay between the microcell segments.

The foregoing is merely illustrative of the principles of this invention and various modifications can be made by those skilled in the art. The foregoing embodiments may be implemented individually or in any combination.

What is claimed is:

1. A semiconductor device comprising:
   a substrate;
   a plurality of microcells in the substrate, wherein each one of the microcells comprises first and second single-photon avalanche diodes separated by intra-microcell isolation structures; and
   inter-microcell isolation structures formed between the adjacent microcells.

2. The semiconductor device defined in claim 1, wherein the intra-microcell isolation structures are different than the inter-microcell isolation structures.

3. The semiconductor device defined in claim 2, wherein the inter-microcell isolation structures comprise deep trench isolation structures and wherein the intra-microcell isolation structures do not include any deep trench isolation structures.

4. The semiconductor device defined in claim 2, wherein the inter-microcell isolation structures comprise local oxidation of silicon structures and polysilicon-filled trenches.

5. The semiconductor device defined in claim 4, wherein the intra-microcell isolation structures comprise local oxidation of silicon structures and wherein the intra-microcell isolation structures do not include polysilicon-filled trenches.

6. The semiconductor device defined in claim 1, wherein each one of the microcells comprises:
   a first electrical connection between the first single-photon avalanche diode and a first output line; and
   a second electrical connection between the second single-photon avalanche diode and a second output line.

7. The semiconductor device defined in claim 6, wherein the first electrical connection is between a first anode of the first single-photon avalanche diode and the first output line and wherein the second electrical connection is between a second anode of the second single-photon avalanche diode and the second output line.

8. The semiconductor device defined in claim 1, wherein each one of the microcells comprises:
   a first resistor;
   a second resistor;
   a first electrical connection between the first single-photon avalanche diode and the first resistor; and
   a second electrical connection between the second single-photon avalanche diode and the second resistor.

9. The semiconductor device defined in claim 8, wherein the first electrical connection is between a first cathode of the first single-photon avalanche diode and the first resistor and wherein the second electrical connection is between a second cathode of the second single-photon avalanche diode and the second resistor.

10. A silicon photomultiplier comprising:
a semiconductor substrate; and
an array of microcells in the semiconductor substrate, wherein at least one microcell of the array of microcells is a split microcell with first and second microcell segments and wherein a crosstalk probability between the first and second microcell segments is greater than 90%.

11. The silicon photomultiplier defined in claim 10, wherein the first and second microcell segments of the split microcell are separated by a distance that is less than two microns.

12. The silicon photomultiplier defined in claim 10, wherein the first microcell segment includes a first single-photon avalanche diode and wherein the second microcell segment includes a second single-photon avalanche diode.

13. The silicon photomultiplier defined in claim 12, wherein the split microcell further comprises:
a first resistor;
a second resistor;
a first contact between the first single-photon avalanche diode and the first resistor; and
a second contact between the second single-photon avalanche diode and the second resistor.

14. The silicon photomultiplier defined in claim 10, wherein the split microcell further comprises:
a first contact between the first microcell segment and a first output line; and
a second contact between the second microcell segment and a second output line.

15. The silicon photomultiplier defined in claim 10, further comprising:
trench isolation structures formed around a perimeter of the split microcell.

16. The silicon photomultiplier defined in claim 15, further comprising:
isolation structures that are different than the trench isolation structures and that are formed between the first and second microcell segments of the split microcell.

17. A semiconductor device comprising:
a substrate;
a plurality of single-photon avalanche diodes in the substrate;
first isolation structures that surround pairs of single-photon avalanche diodes; and
second isolation structures formed between the single-photon avalanche diodes of each of the pairs of single-photon avalanche diodes, wherein a crosstalk probability between the single-photon avalanche diodes of each of the pairs of single-photon avalanche diodes is greater than 90%, wherein the second isolation structures are different than the first isolation structures and wherein the first isolation structures comprise deep trench isolation structures.

\* \* \* \* \*